(12) United States Patent
Bang

(10) Patent No.: US 7,659,186 B2
(45) Date of Patent: Feb. 9, 2010

(54) METHOD OF MANUFACTURING CMOS IMAGE SENSOR

(75) Inventor: Sun Kyung Bang, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 236 days.

(21) Appl. No.: 11/948,808

(22) Filed: Nov. 30, 2007

(65) Prior Publication Data

US 2008/0160666 A1 Jul. 3, 2008

(30) Foreign Application Priority Data

Dec. 29, 2006 (KR) .................. 10-2006-0137362

(51) Int. Cl.
*H01L 21/425* (2006.01)
(52) U.S. Cl. .................. 438/514; 438/75; 438/301; 438/531
(58) Field of Classification Search .................. 438/73, 438/75, 299, 301, 369, 514, 531, 717, 945, 438/947
See application file for complete search history.

(56) References Cited

U.S. PATENT DOCUMENTS

| | | | | |
|---|---|---|---|---|
| 6,416,933 B1 * | 7/2002 | Singh et al. | .................. | 438/696 |
| 6,653,058 B2 * | 11/2003 | Vahedi et al. | ................ | 438/694 |
| 6,946,400 B2 * | 9/2005 | Chung | .................. | 438/706 |
| 7,183,205 B2 * | 2/2007 | Hong | .................. | 438/671 |
| 7,491,343 B2 * | 2/2009 | Adams et al. | ................ | 438/723 |

* cited by examiner

*Primary Examiner*—Kevin M Picardat
(74) *Attorney, Agent, or Firm*—Workman Nydegger

(57) ABSTRACT

A method for manufacturing the CMOS image sensor comprising forming an epitaxial layer provided with a plurality of photo diodes on a semiconductor substrate, coating a first photo resist on the epitaxial layer and performing a patterning process on the first photo resist using a predetermined reference value in order to form a first photo resist pattern, coating a second photo resist on the epitaxial layer and first photo resist pattern and performing a patterning process for the second photo resist in order to form the second photo resist pattern on the first photo resist pattern; and forming a well area of a pixel area by performing a dopant implantation process using a mask pattern including the first photo resist pattern and the second photo resist pattern.

13 Claims, 2 Drawing Sheets

METHOD OF MANUFACTURING CMOS IMAGE SENSOR

CROSS-REFERENCES AND RELATED APPLICATIONS

This application claims the benefit of Korean Patent Application No. 10-2006-0137362, filed on Dec. 29, 2006, which is hereby incorporated by reference in its entirety.

BACKGROUND OF THE INVENTION

1. Field of the Invention

The present invention relates to an image sensor. More specifically, the present invention relates to a method for manufacturing a CMOS image sensor using a photo resist mask pattern with a more accurate size.

2. Discussion of the Related Art

An image sensor is a device which is capable of converting an optical image into an electrical signal. Typically, image sensors are either complementary metal-oxide-silicon (CMOS) image sensors or charge coupled device (CCD) image sensors. The CCD image sensor has excellent photo sensitivity and noise characteristics, but are difficult to use in highly-integrated devices and have high power consumption rates as compared to the CMOS image sensor. In comparison, the CMOS image sensors have simpler processes, are more suitable for highly-integrated devices and have a lower power consumption than the CCD image sensor. Because of these advantages, various techniques for manufacturing a CMOS image sensor for semiconductor devices have been developed.

Generally, the pixel of the CMOS image sensor comprises photodiodes capable of receiving light and transistors capable of receiving image signal input from the photodiodes. The CMOS image sensors are either three T types or four T types, depending on the number of the transistors. Typically, a 3 T type CMOS image sensor includes one photo diode and three transistors, while the four T type sensor has one photo diode and four transistors.

One important aspect of the CMOS image sensors of the related art is a pixel area capable of receiving light in order to generate a signal. As shown in FIG. 1A, the pixel area includes a well (not shown) that is formed in an implantation process using photo resist mask patterns 2 and 3.

Ideally, as shown in FIG. 1B, a butterfly-shaped mask pattern 2 is fabricated and used so that the well is formed to a predetermined size of, for example, 0.25 μm, while an island-shaped mask pattern 3 is formed with the width of, for example, 0.76 μm.

However, in the manufacturing processes of the related art the distance between portions of the butterfly-shaped mask pattern 2 which are used to form the well and the size of the island-shaped mask pattern 3 are properly correlated. Specifically, the well is first formed with a width that is equal to the predetermined width of the well. This distance is modified during the subsequent implantation process, resulting in a well area is not properly formed. Because the final well area has the incorrect size, there are problems properly driving the transistor of the pixel area.

Specifically, in the related art the size of the butterfly-shaped mask pattern 2 and the size of the island-shaped mask pattern 3 are not accurately correlated to account for the difference in the pattern types, since one is typically implemented as a positive pattern while the other is a negative pattern. Thus, if the butterfly-shaped mask pattern 2 is sized to create a well of 0.25 μm, the resulting island-shaped mask pattern 3 is approximately 0.46 μm, rather than 0.76 μm as desired.

Accordingly, in order to form a well so that the transistor of the pixel area is accurately driven, it is necessary to implement a photo resist mask pattern of an accurate size.

BRIEF SUMMARY OF THE INVENTION

In order to solve these and other problems, it is an object of the prevent invention to provide a method for manufacturing a CMOS image sensor using an accurately sized photo resist mask pattern that is formed in order to adequately form the well of the CMOS image sensor.

In order to accomplish the above object, one aspect of the invention is a method for manufacturing the CMOS image sensor comprising forming an epitaxial layer provided with a plurality of photo diodes on a semiconductor substrate, coating a first photo resist on the epitaxial layer and performing a patterning process on the first photo resist using a predetermined reference value in order to form a first photo resist pattern, coating a second photo resist on the epitaxial layer and first photo resist pattern and performing a patterning process for the second photo resist in order to form the second photo resist pattern on the first photo resist pattern, and forming a well area of a pixel area by performing a dopant implantation process using a mask pattern including the first photo resist pattern and the second photo resist pattern.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Hereinafter, the embodiment of the present invention will be described in detail with reference to accompanying drawings. In describing the present invention, the detailed description of known manufacturing steps or known elements will be omitted in order to focus on the inventive aspects of the present invention.

Figure 2A:
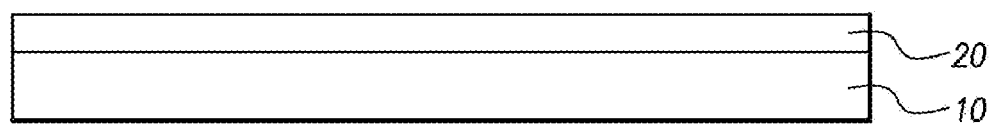
FIGS. 2A to 2D are cross-sectional views of a method for manufacturing a CMOS image sensor according to an embodiment of the present invention.
Figure 2B:
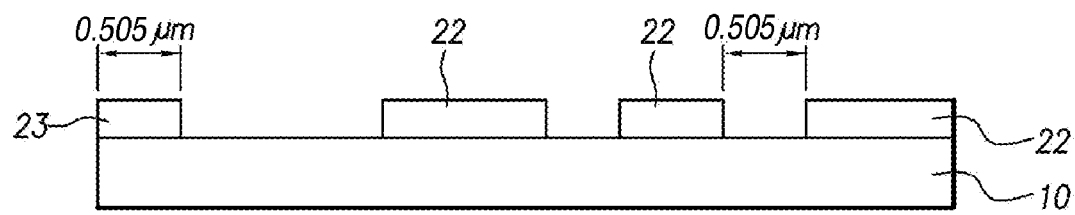

FIGS. 2A to 2D are cross-sectional views of a method for manufacturing a CMOS image sensor according to an embodiment of the present invention. As shown in FIG. 2A, in the method begins as a first photo resist 20 is coated and formed on an epitaxial layer 10 formed on a semiconductor substrate, using an epitaxial process. The epitaxial layer 10 includes a plurality of photodiodes (not shown).

Then, after forming the first photo resist 20, a patterning process for the first photo resist pattern 20 is performed using a reactive ion etch method, wherein the mean value between the desired width of the well and width of island-shaped mask pattern is used as a critical dimension (CD) value.

Figure 1A:
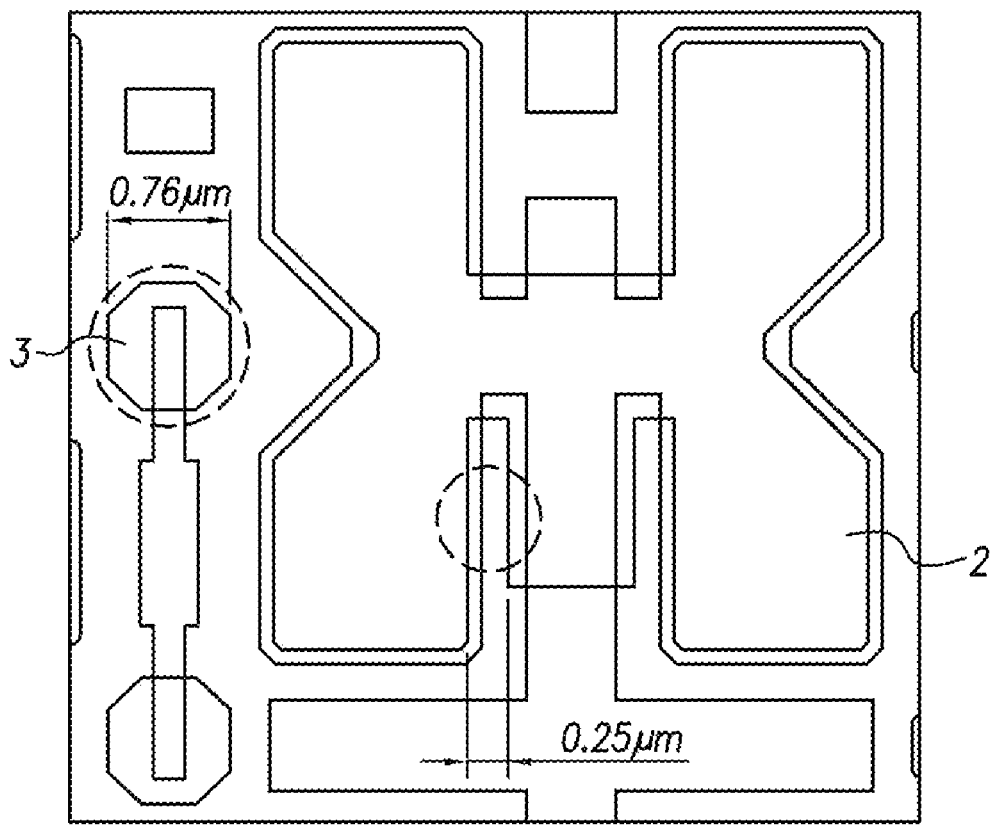
FIG. 1A is an exemplary view showing a photo resist mask pattern which may be used to form a well of a pixel area during a CMOS image sensor manufacturing process.
Figure 1B:
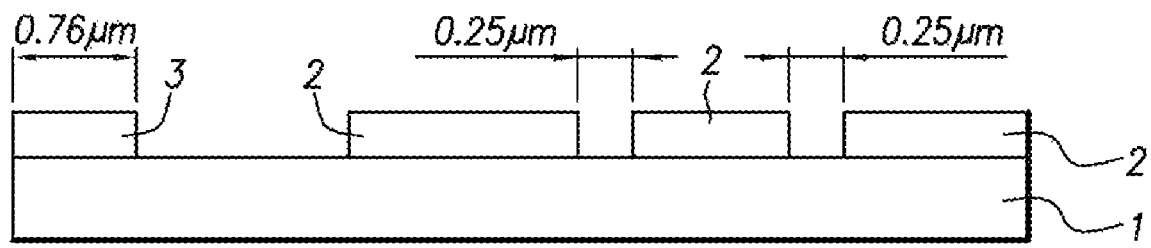
FIG. 1B is a cross-sectional view showing the cross section of the photo resist mask pattern shown of FIG. 1A.

For example, in the previously described example of FIG. 1A, wherein the well-forming space between portions of the butterfly-shaped mask pattern 2 in the FIG. 1 is 0.25 μm, and the width of the island-shaped mask pattern 0.76 μm, the patterning process for the first photo resist 20 is performed using a critical dimension (CD) value of 0.505 μm, which is the mean value of 0.25 μm and 0.76 μm.

As described above, if the patterning process for the first photo resist 20 is performed using a critical dimension of 0.505 μm, then the distance between portions of the first main mask pattern 22 in the well forming area and the width of the first island-shaped masked pattern 23 are both 0.505 μm. Therefore, both distances are greater than 0.25 μm, which is desired distance between the side walls of the well, and be smaller than 0.76 μm, which is the desired size of the island-shaped mask pattern.

Then, a hard bake process is performed for the first mask pattern 22 and 23 to cure the first mask pattern 22 and 23, making it possible to accurately form a second mask pattern 32 and 33 on the first mask pattern 22 and 23.

Figure 2C:
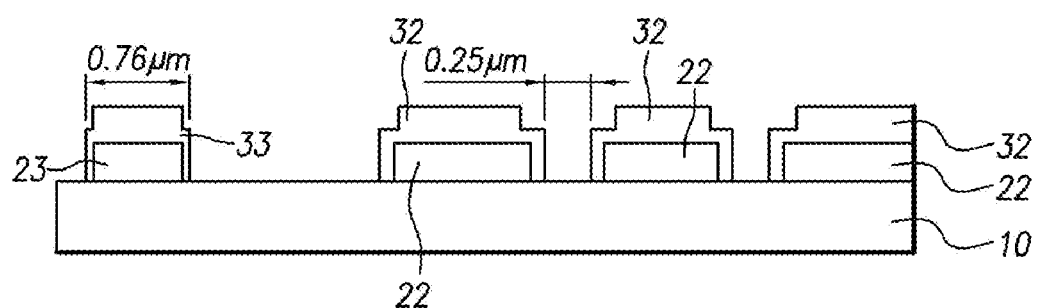
Figure 2D:
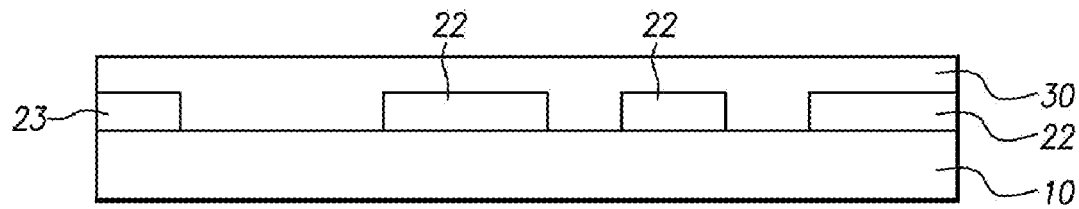

Then, as shown in FIG. 2C, a second photo resist 30 is coated and formed on the epitaxial layer 10 including the first mask pattern 22 and 23. Next, a patterning is performed for the second photo resist 30 so that the distance between the portions of the main mask pattern becomes 0.25 μm, and the size of the island-shaped mask pattern becomes 0.76 μm.

Specifically, the patterning is performed for the second photo resist 30 using an dry etching process, such as a reactive ion etch (RIE) process in order to form a second main mask pattern 32 on the first main mask pattern 22 with a width 0.505 μm so that of the resulting gap, wherein the well is formed is 0.25 μm. At the same time, the second island-shaped mask pattern 33 is formed on the first island-shaped mask pattern 23 with a width of 0.50 μm so that the resulting width of 0.76 μm can be obtained.

As may be understood by one of ordinary skill in the art, more than two patterning process may be used. Therefore, a plurality of patterning processes for a plurality of photo resists can be performed in order to obtain a photoresist of the appropriate size.

Accordingly, a plurality of patterning processes which use a plurality of the photo resists may be performed in order to form a mask pattern with gaps and widths of a predetermined size.

Then, an implantation process may performed on the mask pattern with the predetermined gap between portions of the main mask pattern and predetermined width of the island-shaped mask pattern in order to form the well area of the pixel area.

It should be noted that although the technical idea of the present invention has been described in detail with reference to the preferred embodiments, the embodiment described above is included in order to adequately describe the present invention, rather than as a limitation of its scope. Thus, it can be understood by those skilled in the art that various implementations can be made within the scope of the present invention.

As described above, the present invention utilizes a plurality of patterning processes for the plurality photo resists which take into account the various aspects of the shape of the photo resist mask pattern in order to form a mask pattern with appropriately sized gaps and widths. Then an implantation process is performed on the mask pattern to form an accurately sized well area in the pixel area, thereby making it possible to improve the performance of the CMOS image sensor.

What is claimed is:

1. A method for manufacturing a CMOS image sensor, the method comprising:
    forming an epitaxial layer provided with a plurality of photo diodes on a semiconductor substrate;
    coating a first photo resist on the epitaxial layer and performing a patterning process for the first photo resist using a predetermined reference value in order to form a first photo resist pattern;
    coating a second photo resist on the epitaxial layer and first photo resist pattern and performing a patterning process for the second photo resist in order to form a second photo resist pattern on the first photo resist pattern; and
    forming a well area of a pixel area by performing a dopant implantation process using a mask pattern including the first photo resist pattern and the second photo resist pattern.

2. The method for manufacturing the CMOS image sensor according to claim 1, wherein the mask pattern comprises a main mask pattern and an island-shaped mask pattern and the predetermined reference value is the mean value of the width of a gap between portions of the main mask pattern and the width of the island-shaped mask pattern.

3. The method for manufacturing the CMOS image sensor according to claim 1, wherein performing the patterning process on the first photo resist comprises etching the first photo resist using a reactive ion etch (RIE) method.

4. The method for manufacturing the CMOS image sensor according to claim 1, wherein performing the patterning process for the second photo resist comprises performing a plurality of patterning processes in order to form a plurality of photo resist patterns provided on the first photo resist pattern.

5. The method for manufacturing the CMOS image sensor according to claim 1, wherein performing the patterning process on the second photo resist comprises etching the second photo resist using a dry etching method.

6. The method for manufacturing the CMOS image sensor according to claim 2, wherein the predetermined reference value is selected so that the width of the first photo resist pattern is wider than width of the space between portions of the main mask pattern and narrower than the width the island-shaped mask pattern of the mask pattern.

7. The method for manufacturing the CMOS image sensor according to claim 1, further comprising:
    performing a hard bake process to cure the first photoresist pattern.

8. A method for manufacturing a CMOS image sensor using a mask pattern including a main mask pattern and an island-shaped mask pattern, the method comprising:
    forming an epitaxial layer provided with a plurality of photo diodes on a semiconductor substrate;
    coating a first photo resist on the epitaxial layer and performing a patterning process for the first photo resist using a predetermined reference value in order to form a first photo resist pattern;
    coating a second photo resist on the epitaxial layer and first photo resist pattern and performing a patterning process for the second photo resist in order to form a second photo resist pattern on the first photo resist pattern; and
    forming a well area of a pixel area by performing a dopant implantation process using a mask pattern including the first photo resist pattern and the second photo resist pattern;
    wherein the predetermined reference value is the mean value of the width of a gap between portions of the main mask pattern and the width of the island-shaped mask pattern.

9. The method for manufacturing the CMOS image sensor according to claim 8, wherein performing the patterning process on the first photo resist comprises etching the first photo resist using a reactive ion etch (RIE) method.

10. The method for manufacturing the CMOS image sensor according to claim 8, wherein performing the patterning process for the second photo resist comprises performing a plurality of patterning processes in order to form a plurality of photo resist patterns provided on the first photo resist pattern.

11. The method for manufacturing the CMOS image sensor according to claim 8, wherein performing the patterning process on the second photo resist comprises etching the second photo resist using a dry etching method.

12. The method for manufacturing the CMOS image sensor according to claim 8, wherein the predetermined reference value is selected so that the width of the first photo resist pattern is wider than width of the space between portions of the main mask pattern and narrower than the width the island-shaped mask pattern of the mask pattern.

13. The method for manufacturing the CMOS image sensor according to claim 8, further comprising:

performing a hard bake process to cure the first photoresist pattern.

\* \* \* \* \*